(12) United States Patent
Hata

(10) Patent No.: US 6,369,506 B1
(45) Date of Patent: Apr. 9, 2002

(54) LIGHT EMITTING APPARATUS AND METHOD FOR MOUNTING LIGHT EMITTING DEVICE

(75) Inventor: Toshio Hata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/448,899

(22) Filed: Nov. 29, 1999

(30) Foreign Application Priority Data

Nov. 27, 1998 (JP) ............................................ 10-337455

(51) Int. Cl.⁷ ................................................ H01S 1/62
(52) U.S. Cl. ........................... 313/499; 257/13; 257/79; 313/500; 313/506; 313/512
(58) Field of Search .................................. 313/499, 500, 313/506, 512; 257/13, 103, 749, 81, 85, 86, 94, 99

(56) References Cited

U.S. PATENT DOCUMENTS

| | | | | |
|---|---|---|---|---|
| 5,563,422 A | * | 10/1996 | Nakamura et al. | 257/13 |
| 5,585,648 A | * | 12/1996 | Tischler | 257/77 |
| 6,121,636 A | * | 9/2000 | Morita et al. | 257/99 |
| 6,169,294 B1 | * | 1/2001 | Biing-Jye et al. | 257/79 |

* cited by examiner

*Primary Examiner*—Vip Patel
*Assistant Examiner*—Ken A Berck
(74) *Attorney, Agent, or Firm*—Nixon & Vanderhye P.C.

(57) ABSTRACT

According to one aspect of the present invention, there is provided a light emitting apparatus including: a light emitting device for emitting light; and a first lead frame and a second lead frame on which the light emitting device is mounted. In this apparatus, the light emitting device includes: a substrate which is light transmissive, the substrate defining an output surface; a semiconductor layer formed on the substrate which includes a light emitting layer made of a nitride semiconductor; a first electrode provided lower than a plane running parallel through the light emitting layer with respect to the substrate; and a second electrode provided higher than the plane running parallel through the light emitting layer with respect to the substrate; the first lead frame includes a first lead pad section to which the first electrode is connected; the second lead frame includes a second lead pad section to which the second electrode is connected; at least one of the first and second lead frames includes a die pad section on which the substrate is mounted; and the die pad section does not substantially cover the first output surface.

11 Claims, 8 Drawing Sheets

PRIOR ART ing device. In

LIGHT EMITTING APPARATUS AND METHOD FOR MOUNTING LIGHT EMITTING DEVICE

BACKGROUND OF THE INVENTION

1. Field of the Invention

The present invention relates to a light emitting apparatus incorporating a semiconductor light emitting device using a nitride semiconductor (e.g., gallium nitride compound semiconductor $In_xAl_yGa_{1-x-y}N$, where $0 \leq x$, $0 \leq y$, and $x+y \leq 1$) and a method for mounting the light emitting device. In particular, the present invention relates to a light emitting apparatus incorporating a nitride semiconductor light emitting device including a substrate which transmits light therethrough and a method for mounting the light emitting device.

2. Description of the Related Art

Typically, a nitride semiconductor light emitting device is produced by depositing a semiconductor multilayer which includes a number of nitride semiconductor layers on an insulative substrate. The semiconductor multilayer is then partially etched into a step like shape. Then a p-type electrode and an n-type electrode are formed on the semiconductor multilayer. The n-type electrode is formed on a lower step of the partially etched semiconductor multilayer. Thus, the height of the n-type electrode differs from that of the p-type electrode. Typically, the n-type electrode is formed at a height which is about 1 μm lower than that of the p-type electrode. One way to emit the light from the nitride semiconductor light emitting device is to include a light transmissive substrate. Conventional mounting methods for electrically connecting such p-type and n-type electrodes formed at different heights to respective electrodes of respective lead frames will be described below.

For example, Japanese Laid-open Patent Publication No. 9-181394 discloses a method in which a nitride semiconductor light emitting device provided with a height difference is mounted on a heat sink that is also provided with a height difference so as to conform with the height difference between the p-type electrode and the n-type, electrode of the light emitting device. FIG. 8 is a schematic diagram illustrating the mounting method. Referring to FIG. 8, a p-type electrode 71 and an n-type electrode 72 are formed on one side of a nitride semiconductor light emitting device 70. A height difference section 700 is provided in a heat sink 73 so as to match with the height difference between the p-type electrode 71 and the n-type electrode 72. The n-type and p-type electrodes 72 and 71 are connected to lead electrodes 75 and 74, respectively, with a conductive material 77.

Japanese Laid-open Patent Publication No. 6-177434 discloses another conventional method for mounting a nitride semiconductor light emitting device, in which the height of an n-type electrode is adjusted to match with that of a p-type electrode. FIG. 9 is a schematic diagram illustrating the mounting method. A thick n-type electrode 80 and a thin p-type electrode 81 are formed on a nitride semiconductor light emitting device 79 so that the surface heights thereof match with each other. The n-type and p-type electrodes 80 and 81 are surrounded by an insulative protective film 82, and connected to lead electrodes 85 and 86 via conductive adhesive layers 83 and 84, respectively.

The first conventional method shown in FIG. 8 has the following problems. In this method, the nitride semiconductor light emitting device 70 needs to be mounted on the heat sink 73 while the p-type electrode 71 and the n-type electrode 72 of the light emitting device 70 are simultaneously placed on (and thus connected to) the lead electrodes 74 and 75 of the heat sink 73, respectively. Therefore, the method requires a very high die bonding accuracy. This causes difficulties during the manufacture of the light emitting device.

The second conventional method shown in FIG. 9 has the following problems. When this method is used with an ordinary light emitting diode or laser, the n-type electrode 80 needs to be as thick as about 1 μm. Such a thick electrode complicates the production process. In stead of making the n-type electrode 80 thicker than the p-type electrode 81, the conductive adhesive layer 83 may be made thicker than the conductive adhesive layer 84 to similarly compensate for the height difference. In such a case, during a die-bonding process for the nitride semiconductor light emitting device, the conductive adhesive material may extend beyond the periphery of the electrode 80 or 81, which may short-circuit the electrodes 80 and 81 with each other. Thus, the production yield may be reduced considerably.

In either one of the conventional methods described above, since the semiconductor layer side is fixed to the heat sink with an adhesive (such as a silver paste and a solder), the semiconductor layer tends to be distorted thereby shortening the lifetime of the nitride semiconductor light emitting device.

Another problem with a conventional light emitting device is that the emission efficiency is decreased because the emitting light is absorbed and scattered by the electrodes formed on the semiconductor layer.

As described above, it has been difficult to provide a method for mounting a nitride semiconductor light emitting device, which improves the emission efficiency and hence the lifetime thereof.

SUMMARY OF THE INVENTION

According to one aspect of the present invention, there is provided a light emitting apparatus including: a light emitting device for emitting light; and a first lead frame and a second lead frame on which the light emitting device is mounted. In this apparatus, the light emitting device includes: a substrate which is light transmissive, the substrate defining an output surface; a semiconductor layer formed on the substrate which includes a light emitting layer made of a nitride semiconductor; a first electrode provided lower than a plane running parallel through the light emitting layer with respect to the substrate; and a second electrode provided higher than the plane running parallel through the light emitting layer with respect to the substrate; the first lead frame includes a first lead pad section to which the first electrode is connected; the second lead frame includes a second lead pad section to which the second electrode is connected, at least one of the first and second lead frames includes a die pad section on which the substrate is mounted; and the die pad section does not substantially cover the first output surface.

In one embodiment of the present invention, the light emitting device includes a reflective layer which reflects the light generated in the light emitting layer toward the substrate.

In another embodiment of the present invention, the reflective layer is formed between the light emitting layer and the second electrode.

In still another embodiment of the present invention, the reflective layer is formed to surround the light emitting device.

In still another embodiment of the present invention, the semiconductor layer includes at least a pair of cladding layers, the light emitting layer being made of a gallium nitride type compound semiconductor and being formed between the cladding layers; the reflective layer is a multilayer film including at least two different types of layers which are alternately deposited on one another; and the at least two different types of layers include a first layer made of a nitride semiconductor and having a refractive index of n, and a thickness of $\lambda/(4 \cdot n_1)$ (where $\lambda$ denotes an emission wavelength of the light emitting device), and a second layer made of a nitride semiconductor with a refractive index of $n_2$ and having a thickness of $\lambda/4 \cdot n_2$.

In still another embodiment of the present invention, the semiconductor layer includes at least a pair of cladding layers, the light emitting layer being made of a gallium nitride type compound semiconductor and being formed between the cladding layers; the second electrode has a property of transmitting light with a specific wavelength: and the reflective layer is an insulative multilayer film which is formed on the second electrode and reflects the light with the specific wavelength.

In still another embodiment of the present invention, the semiconductor layer includes at least a pair of cladding layers, the light emitting layer being made of a gallium nitride type compound semiconductor and being formed between the cladding layers; the second electrode has a property of transmitting light with a specific wavelength; and the reflective layer includes: a first insulative layer formed on the second electrode, the first insulative layer reflecting light with a specific wavelength; and a second layer formed on the first layer, the second layer reflecting the light with the specific wavelength at a high reflectivity.

According to another aspect of the present invention, there is provided a method for mounting a light emitting device includes the steps of: forming a semiconductor layer on a substrate which is light transmissive, the semiconductor layer including a light emitting layer; forming a first electrode lower than a plane running parallel through the light emitting layer with respect to the substrate and a second electrode higher than the plane running parallel through the light emitting layer with respect to the substrate; placing first and second lead frames in a predetermined position with respect to a light emitting device, the first lead frame including a first lead pad section to which the first electrode is connected, the second lead frame including a second lead pad section to which the second electrode is connected, and at least one of the first and second lead frames including a die pad section; mounting the substrate onto the die pad section of the at least one of the first and second lead frames; and electrically connecting the first and second electrodes to the first and second lead pad sections, respectively, wherein the first and second lead pad sections are positioned farther away from the substrate than the first and second electrodes, respectively.

The present invention provides a mounting method in which at least one edge or the periphery of an insulative substrate in a gallium nitride type compound semiconductor light emitting device is fixed to a die pad section of a lead frame, thus allowing the light from the insulative substrate to be emitted efficiently therethrough. This invention also eliminates a short circuit between a p-type electrode and an n-type electrode which are formed on the nitride type semiconductor light emitting device by connecting the electrodes to respective lead pad sections of the lead frames by lead wires. Furthermore, an insulative adhesive is used to fix the substrate of the light emitting device to the die pad sections, thereby preventing an electric short circuit between the lead frames and the light emitting device. Thus, the present invention improves the production yield of a gallium nitride type compound semiconductor light emitting device. Preferably, the insulative adhesive is an epoxy resin, a polyester resin, or a cyanoacrylic resin, or the like, which is colorless and transparent and has a 90 percent or more of light transmissivity for a short wavelength range which includes the emission wavelength of a gallium nitride type compound semiconductor light emitting device. Furthermore, because the substrate side of the light emitting device is fixed to the die pad sections, and distortion of the light emitting device caused by the adhesive element is decreased. Therefore, the operating lifetime of the gallium nitride type semiconductor light emitting device can be prolonged.

The first gallium nitride type semiconductor light emitting device according to the present invention has at least one pair of cladding layers and a light emitting layer on an insulative substrate. The device further includes a multilayer film between one of the electrodes (which is farther away from the substrate) and the light emitting layer. The multilayer film includes at least two types of nitride semiconductor layers. For example; when two different types of nitride semiconductor layers are included in the multilayer film, the respective thicknesses thereof are $\lambda/4n_1$ and $\lambda/4n_2$ (where $\lambda$ denotes the emission wavelength of the device, and $n_1$ and $n_2$ denote the respective refractive indices for the emission wavelength $\lambda$). This prevents the light generated in a light emitting layer and directed away from the substrate from being absorbed and scattered by the electrode. Therefore, the light is more efficiently reflected by the multilayer film toward the light transmissive substrate. Thus, a gallium nitride type compound semiconductor light emitting device which has an excellent emission efficiency can be obtained. Preferably, each of the two types of nitride semiconductor layers is doped with a p-type impurity or an n-type impurity in order to facilitate the passage of an externally injected current. The multilayer film preferably includes about 10 to about 100 pairs of such two different types of semiconductor layers. Below about 10 pairs, a sufficient refractive index may not be obtained. Over about 100 pairs, the series resistance of the multilayer film, and hence the drive voltage, of the light emitting device increases. Each of the two types of nitride semiconductor layers may be an $In_xAl_yGa_{1-x-y}N$ layer ($0 \leq x$, $0 \leq y$, and $x+y \leq 1$), preferably, the two layers are a GaN layer and an $Al_xGa_{1-x}N$ layer ($0<x \leq 0.3$), respectively. In the latter, the Al molar fraction is more than 0 and about 0.3 or less. If the Al molar fraction in the $Al_xGa_{1-x}N$ layer ($0<x \leq 0.3$) is more than about 0.3, the resistance of the layer may be undesirably high, resulting in an undesirable conductivity.

The second gallium nitride type compound semiconductor light emitting device according to the present invention has at least one pair of cladding layers and a light emitting layer on an insulative substrate. The device further includes a thin film electrode on the side opposite to the insulative substrate with respect to the light emitting layer, an insulative multilayer film, and pad electrodes. These elements are deposited in this order. The insulative multilayer film has at least two different types of insulative layers, in which the respective thicknesses thereof are $\lambda/4n_1$ and $\lambda/4n_2$ (where $\lambda$ denotes the emission wavelength of the device, and $n_1$ and $n_2$ denote the respective refractive indices for the emission wavelength $\lambda$). Therefore, the light generated in a light emitting layer and directed away from the substrate is prevented from being absorbed and scattered by the electrode. Since the insulative multilayer film is formed to surround the light emitting device except for the substrate, the light is more efficiently reflected by the multilayer film toward the light transmissive substrate. Thus, a gallium nitride type compound semiconductor light emitting device which has an excellent emission efficiency can be obtained. Preferred materials which may be used for one of the two types of insulative layers that has a higher refractive index include $Al_2O_3$, $CeF_3$, $CeO_2$, $HfO_2$, $MgO$, $Nd_2O_3$, $NdF_3$, $PbO$, $Pr_6O_{11}$, $Sc_2O_3$, $TiO_2$, $TiO$, $Y_2O_3$, $ZrO_2$, etc. Preferred materials for the other insulative layer with a lower refractive index include $CaF_3$, $MgF_2$, $LaF_3$, $LiF$, $MgF_2$, $Na_3AlF_6$, $NaF$, $SiO_2$, $Si_2O_3$, etc.

The third gallium nitride type compound semiconductor light emitting device according to the present invention has at least one pair of cladding layers and a light emitting layer on an insulative substrate. The device further includes a thin film electrode on the side opposite to the insulative substrate with respect to the light emitting layer. The device still further includes at least one type of an insulative layer and a metal layer having a high light reflectivity which are deposited to surround the light emitting device except for the substrate side, thereby the light is more efficiently reflected by the multilayer film toward the light transmissive substrate. Thus, a gallium nitride type compound semiconductor light emitting device which has an excellent emission efficiency can be obtained. For the above-mentioned metal, aluminum(Al) or silver(Ag) is preferred to be used since they have a high light reflectivity in a visible wavelength range.

These and other advantages of the present invention will become apparent to those skilled in the art upon reading and understanding the following detailed description with reference to the accompanying figures.

DESCRIPTION OF THE PREFERRED EMBODIMENTS

A device structure of a gallium nitride type compound semiconductor light emitting device and a mounting method therefor according to the present invention will be described with reference to drawings. However, it should be understood that the present invention is not limited to those examples. Each of the light emitting devices of Examples 1 to 3 below can be used in a laser instead of an LED lamp, and each of the device structures of Examples 1 to 3 below may be combined with any of the lead frames of Examples 1 to 3 below.

A gallium nitride type compound semiconductor light emitting device of any of Examples 1, 2 and 3 of the present invention may be produced by a metal-organic chemical vapor deposition (hereinafter, referred to as "MOCVD"), using ammonia($NH_3$) as a group V material, trimethylgallium, trimethylaluminum, or trimethylindium as a group III material, biscyclopentadienylmagnesium ($Cp_2Mg$) as a P-type impurity, monosilane as an N-type impurity, and hydrogen or nitrogen as a carrier gas.

EXAMPLE 1

Figure 1A:
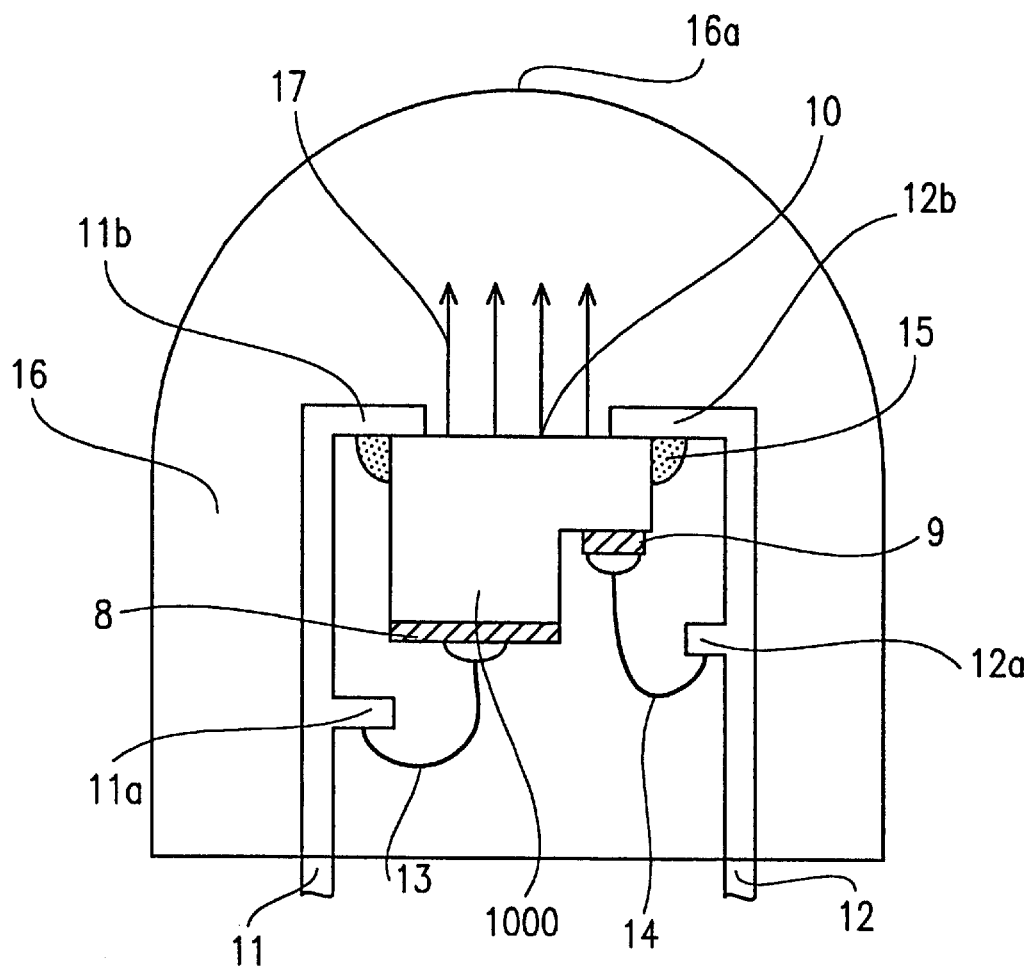
FIGS. 1A and 1B are schematic diagrams illustrating an LED lamp implemented in Example 1 of the present invention.

FIG. 1A shows a schematic diagram illustrating an LED lamp with a device structure 1000 according to Example 1 of the present invention mounted thereon. Lead frames for mounting the device structure 1000 include a positive electrode lead frame 11 and a negative electrode lead frame 12. The lead frames 11 and 12 include lead pads 11a and 12a, and die pads 11b and 12b, respectively. The device structure 1000 is fixed to the die pads 11b and 12b with an insulative adhesive 15 (e.g., an epoxy resin, a polyester resin, or a cyanoacrylic resin). A p-type electrode 8 is connected to the lead pad 11a by a lead wire 13, and an n-type electrode 9 is connected to the lead pad 12a by a lead wire 14. The lead pads 11a and 12a are positioned farther away from the substrate 1 than the electrodes 8 and 9, respectively. The structure 1000 is buried in a dome-shaped body 16 of an epoxy resin, or the like, by a molding process, for example. The body 16 has a convex lens area 16a. Thus, an LED lamp as a light emitting apparatus using a gallium nitride type compound semiconductor light emitting device is produced.

The device structure 1000 includes a substrate 1 (see FIG. 2), one of the surfaces of which is referred to herein as "light transmissive surface 10". In Example 1 to 3, the substrate 1 is a sapphire substrate. Arranging the light transmissive surface 10 to face the area 16a allows light 17 to be output efficiently from the device structure 1000.

Figure 1B:
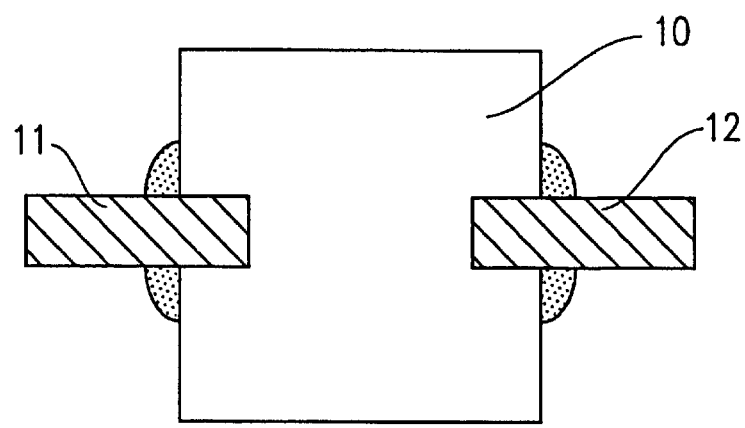

FIG. 1B shows a schematic diagram illustrating the gallium nitride type compound semiconductor light emitting device mounted on the lead frames 11 and 12 seen from the substrate side (which includes the light transmissive surface 10). The light transmissive surface 10 is partially fixed to the die pads 11b and 12b with an insulative adhesive 15 (e.g., an epoxy resin, a polyester resin, or a cyanoacrylic resin). The die pads have shapes that allow the light to be emitted efficiently. Since the p-type and n-type electrodes 8 and 9 are connected to the positive and negative electrode lead frames 11 and 12 by the lead wire 13 and 14, respectively, a short circuit between the electrodes 8 and 9, which may occur in the conventional mounting method in which the p-type and n-type electrodes are connected with a conductive adhesive to lead electrodes, respectively, can be prevented. Further, fixing the substrate 1 to die pads 11b and 12b substantially eliminates the load to the semiconductor layers. Such a load may be applied to the semiconductor layers by the adhesive in the conventional method because the adhesive is in contact with the semiconductor layers, thereby the semiconductor layer is not distorted. Accordingly, a gallium nitride type compound semiconductor light emitting device which has an excellent reliability can be achieved.

Figure 2:
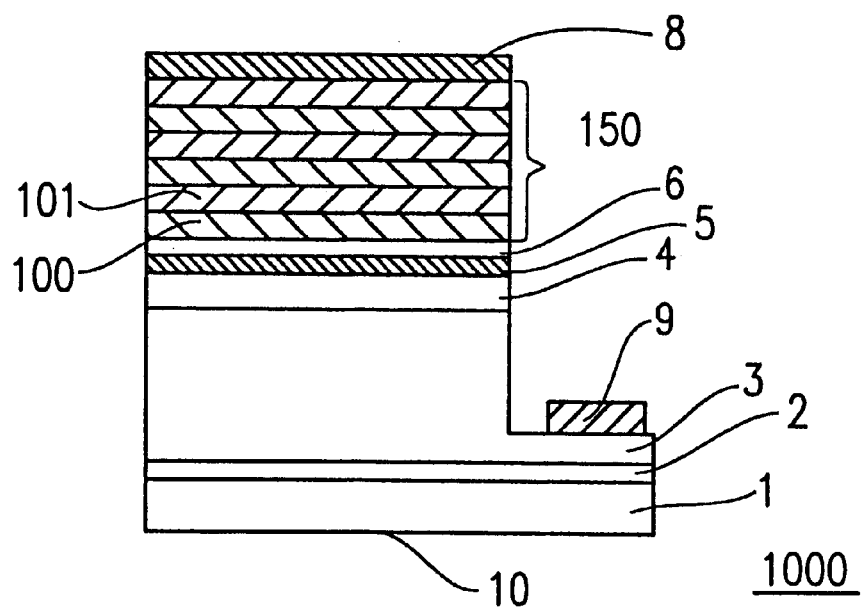
FIG. 2 is a schematic cross-sectional view illustrating a gallium nitride type compound semiconductor light emitting device according to Example 1 of the present invention.

FIG. 2 shows a schematic cross-sectional view illustrating a gallium nitride type compound semiconductor light emitting device according to Example 1 of the present invention. The device structure 1000 includes an AlN buffer layer 2 having a thickness of about 500 Å, an n-type GaN layer 3 having a thickness of about 5 μm, an n-type $Al_{0.05}Ga_{0.95}N$ cladding layer 4 having a thickness of about 0.3 μm, an undoped $In_{0.32}Ga_{0.68}N$ quantum well light emitting layer 5 having a thickness of about 30 Å, a p-type $Al_{0.08}Ga_{0.92}N$ evaporation inhibiting layer 6 having a thickness of about 20 nm, and a multilayer reflective film 150 having about forty pairs of a p-type GaN layer 100 and a p-type $Al_{0.2}Ga_{0.8}N$ layer 101. These layers are deposited in this order on the substrate 1. Further, the n-type electrode 9 is formed on an partially etched and exposed surface of the n-type GaN layer 3, whereas the p-type electrode 8 is formed on the multilayer reflective film 150. Typically, a plurality of such devices are formed on a wafer, and the wafer is diced into chips.

When the emission wavelength of light generated in the light emitting layer 5 is about 460 nm, the multilayer reflective film 150 preferably includes about forty pairs of the p-type GaN layer 100 (thickness: about 47 nm) and the p-type $Al_{0.2}Ga_{0.8}N$ layer 101 (thickness: about 49 nm). Thus the device structure 1000 is obtained.

In the device structure as described above, a current can be provided into the LED lamp (the light emitting apparatus of the present invention) from an external source by connecting the positive electrode lead frame 11 and the negative electrode lead frame 12 shown in FIG. 1A to a power supply. Because the nitride semiconductor multilayer reflective film 150 is provided opposite to the substrate 1, the light generated in the light emitting layer 5 which is directed toward the upper side of FIG. 2 is reflected by the multilayer reflective film 150 toward the substrate. Since the multilayer reflective film 150 is formed as described above and the substrate 1 is light transmissive, the effect of absorption and scattering of the light by the p-type electrode 8 and the n-type electrode 9 can be prevented so that the light can be emitted efficiently from the device structure 1000.

According to the above-mentioned structure of the light emitting apparatus and the mounting method therefor, the light generated in a light emitting layer which is directed away from the substrate is reflected toward the light transmissive substrate. Using such a structure, it is possible to provide a gallium nitride type compound semiconductor having an excellent emission efficiency, in which a short circuit is prevented between the electrodes.

EXAMPLE 2

Figure 3A:
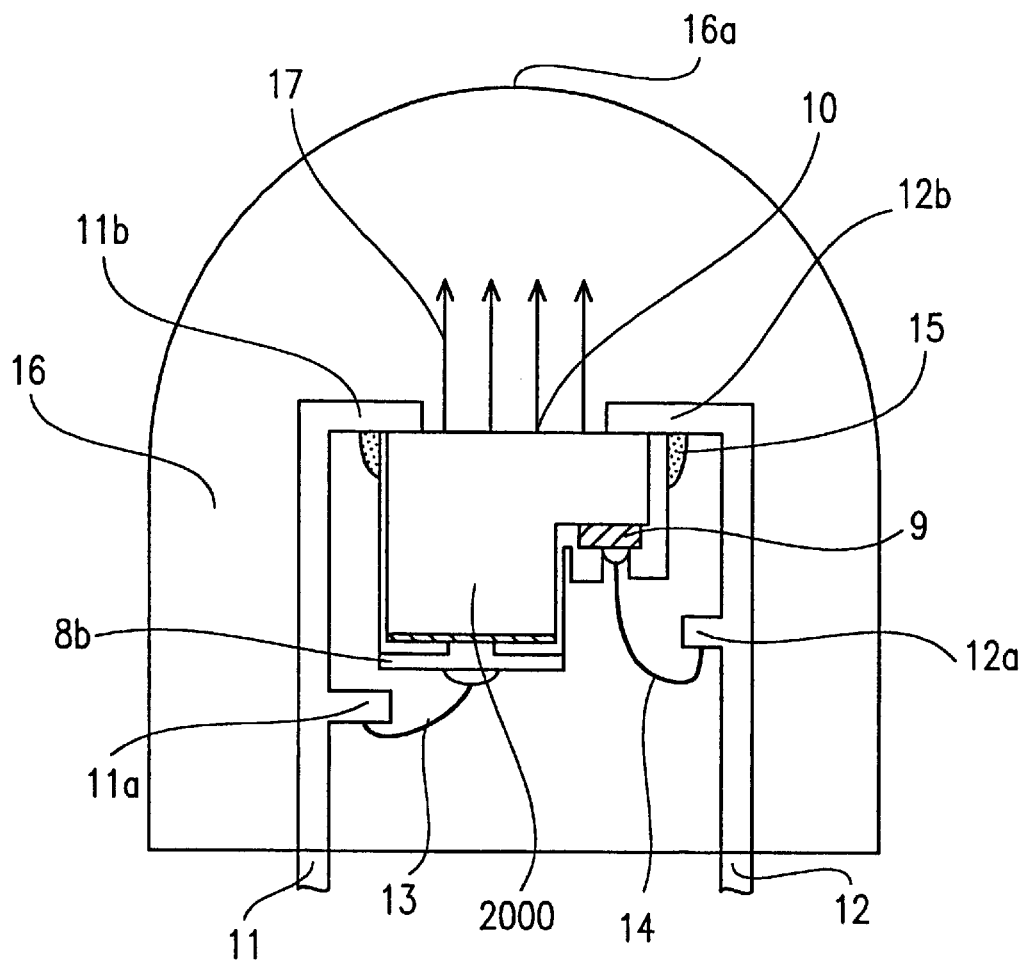
FIGS. 3A and 3B are schematic diagrams illustrating an LED lamp implemented in Example 2 of the present invention.

FIG. 3A shows a schematic diagram illustrating an LED lamp with a device structure 2000 according to Example 2 of the present invention mounted thereon. Lead frames for mounting on the device structure 2000 include a positive electrode lead frame 11 and a negative electrode lead frame 12. The lead frames 11 and 12 include lead pads 11a and 12a and die pads 11b and 12b, respectively. The device structure 2000 is fixed to the die pads 11b and 12b with an insulative adhesive 15 (e.g., an epoxy resin, a polyester resin, or a cyanoacrylic resin). A pad electrode 8b is connected to the lead pad 11a by a lead wire 13, and an n-type electrode 9 is connected to the lead pad 12a by a lead wire 14. The lead pads 11a and 12a are positioned farther away from the substrate 1 than the electrodes 8b and 9, respectively. The structure 2000 is buried into a dome-shaped body 16 of an epoxy resin, or the like, by a molding process, for example. The body 16 has a convex lens area 16a. Thus, an LED lamp as a light emitting apparatus using a gallium nitride type compound semiconductor light emitting device is produced.

The device structure 2000 includes a substrate 1 (see FIG. 4), one of the surfaces of which is referred to herein as "light transmissive surface 10". Arranging the light transmissive surface 10 to face the area 16a allows light 17 to be output efficiently from the device structure 2000.

Figure 3B:
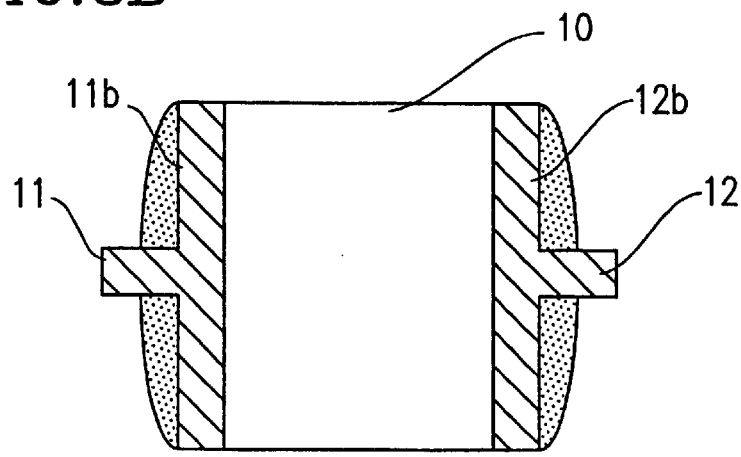

FIG. 3B shows a schematic diagram illustrating the gallium nitride type compound semiconductor light emitting device mounted on the lead frames 11 and 12 seen from the substrate 1 side (which includes the light transmissive surface 10). The light transmissive surface 10 is fixed to the T-shaped die pads 11b and 12b with an insulative adhesive 15 (e.g., an epoxy resin, a polyester resin, or a cyanoacrylic resin). The die pads have shapes that allow the light to be emitted efficiently. Since the pad electrode 8b and the n-type electrodes 9 are connected to the positive and negative electrode lead frames 11 and 12 by the lead wire 13 and 14, respectively, a short circuit between the electrodes 8b and 9, which may occur in the conventional mounting method in which the p-type and n-type electrodes are connected with a conductive adhesive to lead electrodes, respectively, is prevented. Further, fixing the substrate 1 to die pads 11b and 12b substantially eliminates the load to the semiconductor layers, and the semiconductor layer is not distorted. Thus, the operating lifetime of the device is prolonged.

Figure 4:
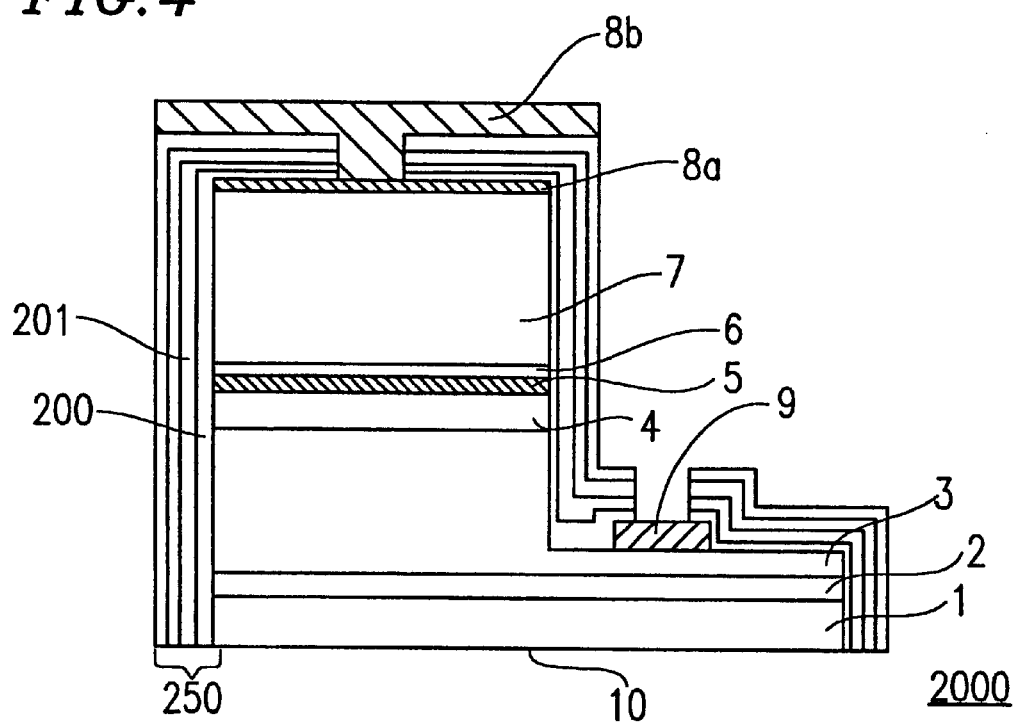
FIG. 4 is a schematic cross-sectional view illustrating a gallium nitride type compound semiconductor light emitting device according to Example 2 of the present invention.

FIG. 4 shows a schematic cross-sectional view illustrating a gallium nitride type compound semiconductor light emitting device according to Example 2 of the present invention. The device structure 2000 includes an AlN buffer layer 2 having a thickness of about 500 Å, an n-type GaN layer 3 having a thickness of about 5 μm, an n-type $Al_{0.05}Ga_{0.95}N$ cladding layer 4 having a thickness of about 0.2 μm, an undoped $In_{0.62}Ga_{0.38}N$ quantum well light emitting layer 5 having a thickness of about 30 Å, a p-type $Al_{0.08}Ga_{0.92}N$ evaporation inhibiting layer 6 having a thickness of about 40 nm, and a p-type GaN contact layer 7 having a thickness of about 0.5 μm. These layers are deposited in this order on the substrate 1. Further, the n-type electrode 9 is formed on an etched and exposed surface of the n-type GaN layer 3, whereas a p-type thin film electrode 8a is formed on the p-type GaN contact layer 7. The p-type thin film electrode 8a may be light transmissive. Typically, a plurality of such devices are formed on a wafer, and the wafer is diced into chips.

Then an insulative multilayer film 250 is formed to surround the light emitting device except for the substrate as shown in FIG. 4. When the emission wavelength of light generated in the light emitting layer 5 is about 565 nm, the insulative multilayer film 250 preferably includes about ten pairs of an $SiO_2$ layer 200 (thickness: about 100 nm) and a $TiO_2$ layer 201 (thickness: about 47 nm). Thus, the device structure 2000 is produced. $SiO_2$ layer and $TiO_2$ layer in the insulative multilayer film 250 may be deposited using a common method such as an electron beam epitaxy method or a sputtering method. The multilayer film 250 is formed to surround the light emitting device except for the substrate 1. This allows the light generated in the light emitting layer 5 which is directed away from the substrate or the lateral side of the device to be reflected toward the substrate side. Because the multilayer reflective film 250 is formed as described above and the substrate I is light transmissive, the light can be emitted efficiently from the device structure 2000 through the substrate 1. Openings are then formed over the p-type thin film electrode 8a and the n-type electrode 9 by partially removing the insulative multilayer film 250 with a hydrofluoric type etchant so that a current can be provided into the LED lamp from an external source. After forming the opening over the p-type electrode 8a, a pad electrode 8b is formed so as to cover the side opposite to the substrate 1 with respect to the emitting layer 5. Thus, the device structure 2000 is produced.

With the device and the mounting method therefor as described above, a current can be provided into the LED lamp (the light emitting apparatus of the present invention) from an external source by connecting the positive electrode lead frame 11 and the negative electrode lead frame 12 to a power supply. In this example of the present invention, not only the light which is directed toward the upper side of FIG. 4 (i.e., directed away from the substrate) but also the light directed toward the lateral side of the device can be reflected toward the substrate side. Thus, the gallium nitride type compound semiconductor light emitting device of this example can obtain a better emission efficiency than that of Example 1.

EXAMPLE 3

Figure 5A:
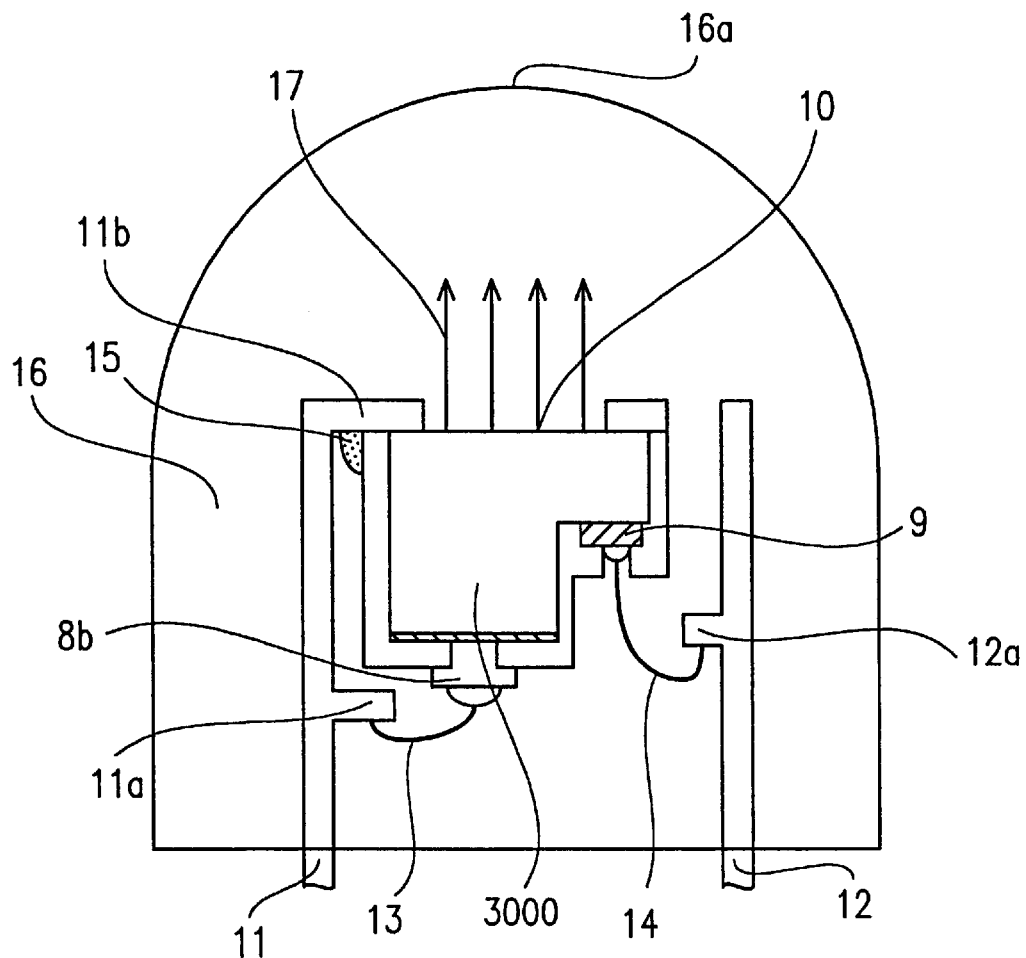
FIGS. 5A and 5B are schematic diagrams illustrating an LED lamp implemented in Example 3 of the present invention.

FIG. 5A shows a schematic diagram illustrating an LED lamp with a device structure 3000 according to Example 3 of the present invention mounted thereon. Lead frames for mounting the device structure 3000 include a positive electrode lead frame 11 and a negative electrode lead frame 12. The lead frame 11 includes a lead pad 11a and a rectangular-shaped die pad 11b, whereas the lead frame 12 includes only a lead pad 12a. The device structure 3000 is fixed to the die pad 11b with an insulative adhesive 15 (e.g., an epoxy resin, a polyester resin, or a cyanoacrylic resin). A pad electrode 8b is connected to the lead pad 11a by a lead wire 13, and an n-type electrode 9 is connected to the lead pad 12a by a lead wire 14 to provide a current into the device from an external source. The lead pads 11a and 12a are positioned farther away from the substrate 1 than the electrodes 8b and 9, respectively. The device structure 3000 is buried in a dome-shaped body 16 of an epoxy resin, or the like, by a molding process, for example. The body 16 has a convex lens area 16a. Thus, an LED lamp as a light emitting apparatus using a gallium nitride type compound semiconductor light emitting device is produced.

The device structure 3000 includes a substrate 1 (see FIG. 6), one of the surfaces of which is referred to herein as "light transmissive surface 10". Arranging the light transmissive surface 10 to face the area 16a allows light 17 to be output efficiently from the device structure 3000.

Figure 5B:
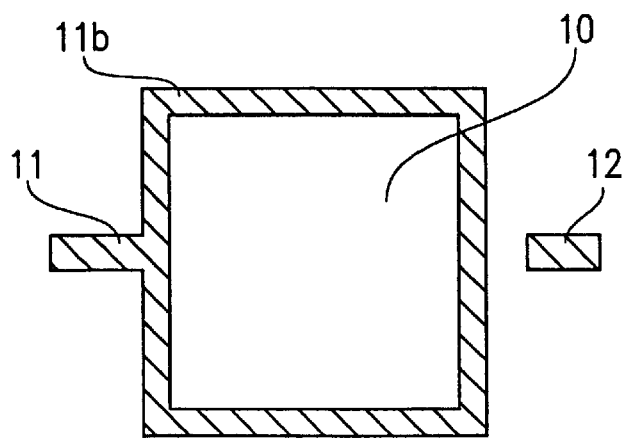
Figure 9:
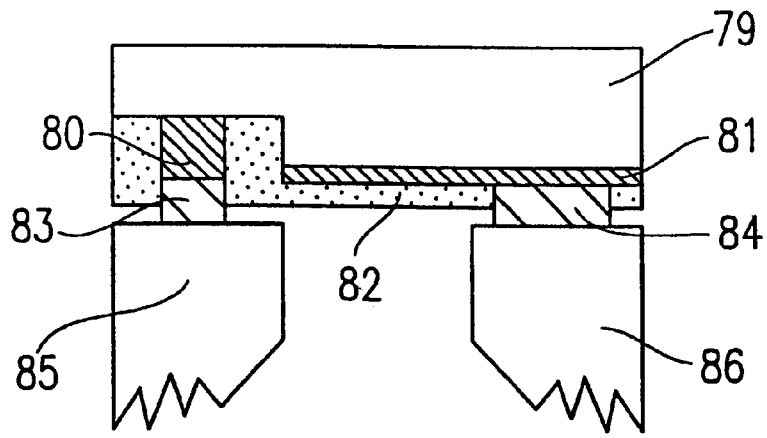
FIG. 9 is a schematic cross-sectional view illustrating a gallium nitride compound semiconductor light emitting device of a flip chip type which is mounted in a conventional manner.

FIG. 5B shows a schematic diagram illustrating the gallium nitride type compound semiconductor light emitting device mounted on the lead frames 11 and 12 seen from the substrate 1 side (which includes the light transmissive surface 10). The light transmissive surface 10 is fixed around the periphery thereof to the rectangular-shaped die pad 11b with an insulative adhesive 15 (e.g., an epoxy resin, a polyester resin, or a cyanoacrylic resin). The die pad has a shape that allows the light to be emitted efficiently. The p-type pad electrode 8b formed on a p-type thin film electrode 8a and the n-type electrode 9 are connected to the positive and negative electrode lead frames 11 and 12, respectively. The p-type thin film electrode 8a may be light transmissive. A short circuit between the electrodes Ba and 9 is prevented, which may occur in the conventional mounting method in which the p-type and n-type electrodes are connected with a conductive adhesive as shown in FIG. 9.

Figure 6:
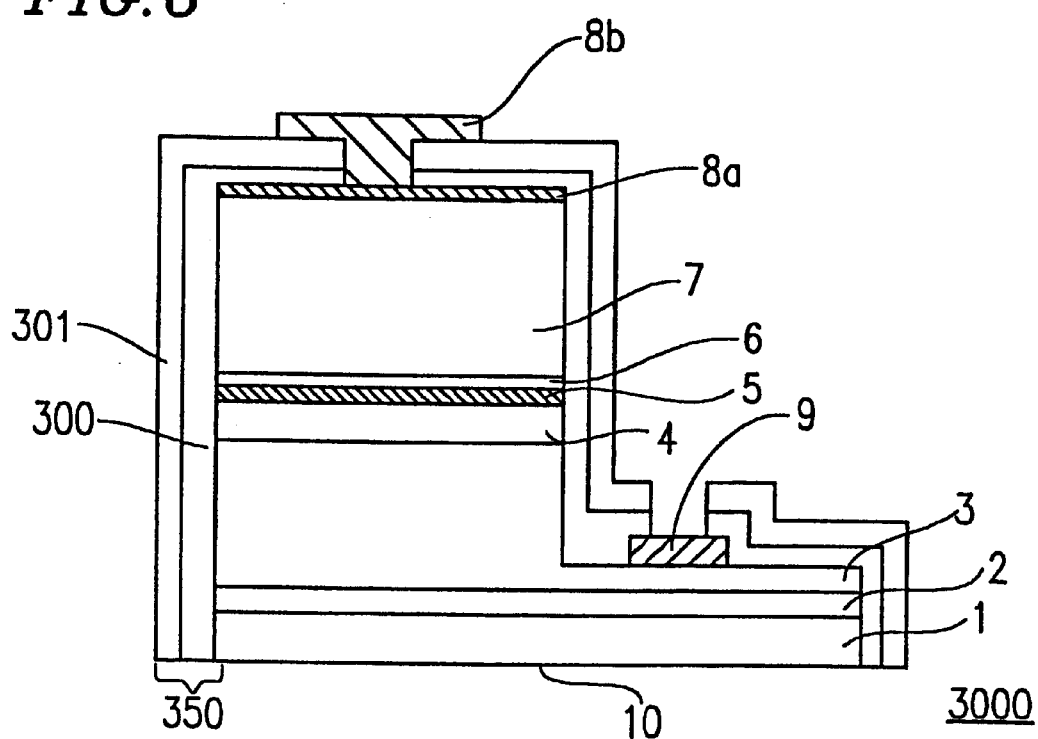
FIG. 6 is a schematic cross-sectional view illustrating a gallium nitride type compound semiconductor light emitting device according to Example 3 of the present invention.

FIG. 6 shows a schematic cross-sectional view illustrating a gallium nitride type compound semiconductor light emitting device mounted on the die pad 11b according to Example 3 of the present invention. The device structure 3000 includes an AlN buffer layer 2 having a thickness of about 500 Å, an n-type GaN layer 3 having a thickness of about 5 $\mu$m, an n-type $Al_{0.05}Ga_{0.95}N$ cladding layer 4 having a thickness of about 0.3 $\mu$m, an undoped $In_{0.66}Ga_{0.34}N$ quantum well light emitting layer 5 having a thickness of about 30 Å, a p-type $Al_{0.08}Ga_{0.92}N$ evaporation inhibiting layer 6 having a thickness of about 60 nm, and a p-type GaN contact layer 7 having a thickness of about 0.5 $\mu$m. These layers are deposited in this order on the substrate 1. Further, the n-type electrode 9 is formed on an etched and exposed surface of the n-type GaN layer 3, whereas the p-type thin film electrode 8a is formed on the p-type GaN contact layer 7. Typically, a plurality of such devices are formed on a wafer, and the wafer is diced into chips.

When the emission wavelength of light generated in the light emitting layer 5 is about 575 nm, the insulative multilayer film 350 preferably includes $SiO_2$ film 300 (thickness: about 0.15 $\mu$m) and metal reflective Al layer 301 (thickness: about 0.1 $\mu$m). The insulative multilayer film 350 is formed to surround the light emitting device except for the substrate 1, using a common method such as an electron beam epitaxy method or a sputtering method. This allows the light generated in the light emitting layer 5 which is directed away from the substrate and toward the lateral side of the device to be reflected toward the substrate side. Since the insulative multilayer film 350 is formed as described above and the substrate I is light transmissive, the light can be emitted efficiently from the device structure 3000. Openings are then formed over the p-type thin film electrode 8a and the n-type electrode 9, by partially removing the $SiO_2$ film 300 and the metal reflective Al layer 301 with a hydrofluoric type etchant so that a current can be provided into the LED lamp from an external source. After forming the opening over the p-type electrode 8a, a pad electrode 8b is formed so as to cover the side opposite to the substrate 1 with respect to the emitting layer 5, thereby the device structure 3000 is produced.

Figure 7:
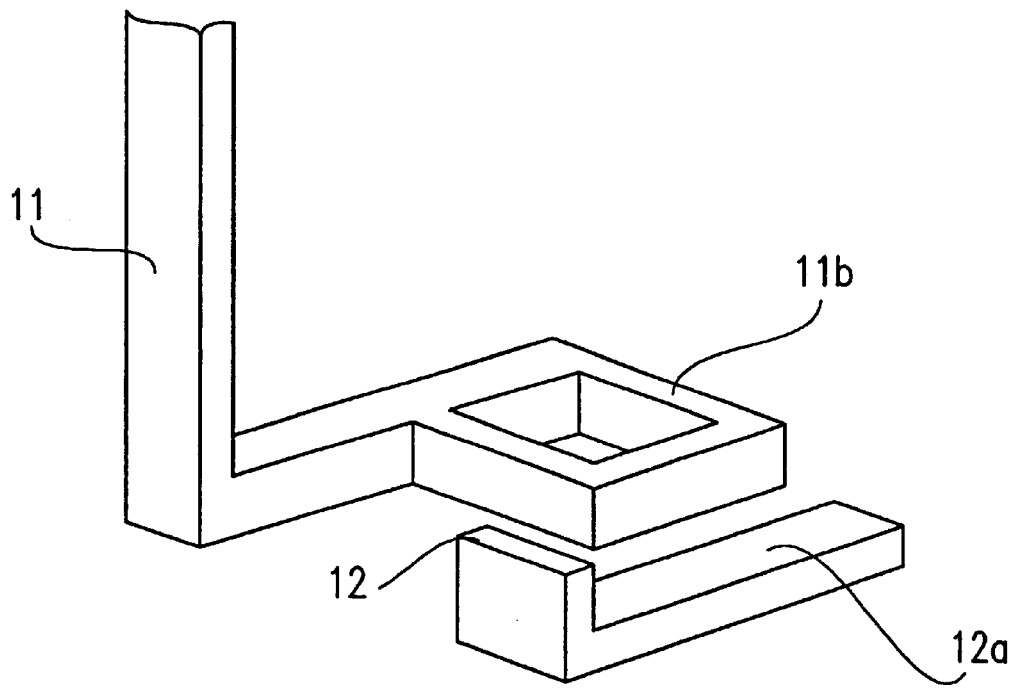
FIG. 7 is a perspective view illustrating lead frames according to Example 3 of the present invention.
Figure 8:
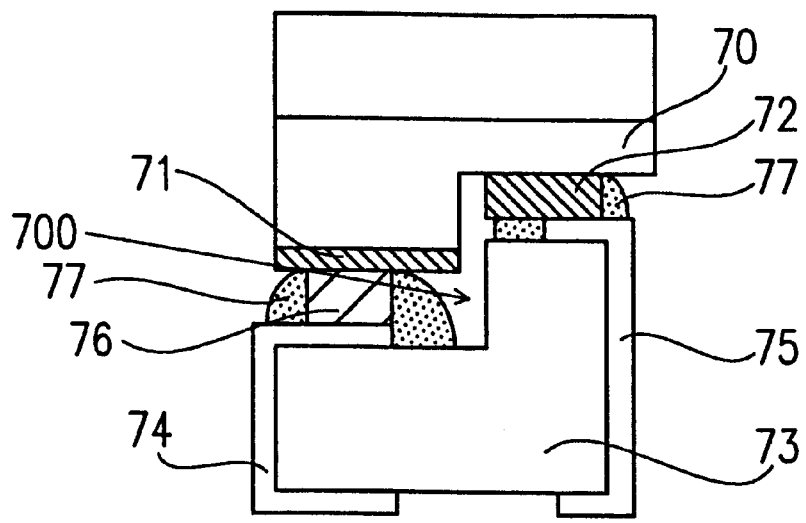
FIG. 8 is a schematic cross-sectional view illustrating a gallium nitride type compound semiconductor light emitting device which is mounted in a conventional manner.

FIG. 7 is a perspective view of the lead frames 11 and 12 according to Example 3. The substrate 1 of the gallium nitride type compound semiconductor light emitting device (not shown) is fixed to the die pad 11b of the lead frame 11 with an insulative adhesive 15. Thus, the light is emitted from the opening of the die pad 11b. As in Examples 1 and 2, fixing the substrate 1 to die pads 11b substantially prevents the load to the semiconductor layers, which may occur in the conventional mounting method. Therefore, the semiconductor layer is not distorted, and hence the lifetime of a gallium nitride type compound semiconductor light emitting device can be prolonged.

Example 2, as described earlier, employs a device structure in which the light generated in a light emitting layer and directed to a light transmissive substrate is reflected by an insulative multilayer film which surrounds the device except for the substrate side. With the device structure of Example 2, however, when the emission wavelength generated in the emitting layer is relatively long, the amount of the light absorbed into the insulative multilayer becomes non-negligible relative to the amount of the light reflected by the multilayer. On the other hand, the device structure of Example 3 includes an insulative layer which can transmit the light generated in an light emitting layer and a metal reflective layer which is formed on the outside of the insulative layer, such that the insulative layer can transmit the light generated in a light emitting layer. The device has an excellent reflectivity since the light is reflected by the metal reflective layer back through the insulative layer, even when the emitting wavelength is relatively long.

Example 3 provides for a gallium nitride type compound semiconductor device which has an excellent emission efficiency even for relatively long emission wavelengths, in which the light generated in the light emitting layer and directed toward the lateral side or the side opposite to the substrate side is reflected toward the light transmissive substrate.

According to the above-mentioned device structures and mounting methods therefor, the light generated in a light emitting layer which is directed away from the substrate is reflected toward the light transmissive substrate. Thus, it is possible to achieve a gallium nitride type compound semiconductor device having an excellent emission efficiency and an improved production yield, in which a short circuit is prevented between the electrodes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting apparatus, comprising:
   a light emitting device for emitting light; and
   a first lead frame and a second lead frame on which the light emitting device is mounted, wherein:
   the light emitting device includes:
      a substrate which is light transmissive, the substrate defining a light output surface;
      a semiconductor layer formed on the substrate, the semiconductor layer including a light emitting layer comprising a nitride semiconductor;
      a first electrode provided lower than a plane running parallel through the light emitting layer with respect to the substrate; and
      a second electrode provided higher than the plane running parallel through the light emitting layer with respect to the substrate;
   wherein the first lead frame includes a first lead pad section to which the first electrode is connected;
   wherein the second lead frame includes a second lead pad section to which the second electrode is connected;
   wherein at least one of the first and second lead frames includes a die pad section on which the substrate is mounted; and
   wherein the die pad section is in contact with a back-side plane or light output surface of the substrate of the light emitting device, and the die pad section is provided with a light transmission section.

2. A light emitting apparatus according to claim 1, wherein the light emitting device includes a reflective layer which reflects the light generated in the light emitting layer toward the substrate.

3. A light emitting apparatus according to claim 2, wherein the reflective layer is formed between the light emitting layer and the second electrode.

4. A light emitting apparatus according to claim 2, wherein the reflective layer is formed to surround the light emitting device.

5. A light emitting apparatus according to claim 3, wherein:
   the semiconductor layer includes at least a pair of cladding layers, the light emitting layer being made of a gallium nitride type compound semiconductor and being formed between the cladding layers;
   the reflective layer is a multilayer film including at least two different types of layers which are alternately deposited on one another; and
   the at least two different types of layers include a first layer made of a nitride semiconductor and having a refractive index of $n_1$ and a thickness of $\lambda/(4 \cdot n_1)$ (where $\lambda$ denotes an emission wavelength of the light emitting device), and a second layer made of a nitride semiconductor with a refractive index of $n_2$ and having a thickness of $\lambda/4 \cdot n_2$.

6. A light emitting apparatus according to claim 4, wherein:
   the semiconductor layer includes at least a pair of cladding layers, the light emitting layer being made of a gallium nitride type compound semiconductor and being formed between the cladding layers;
   the second electrode has a property of transmitting light with a specific wavelength; and
   the reflective layer is an insulative multilayer film which is formed on the second electrode and reflects the light with the specific wavelength.

7. A light emitting apparatus according to claim 4, wherein:
   the semiconductor layer Includes at least a pair of cladding layers, the light emitting layer being made of a gallium nitride type compound semiconductor and being formed between the cladding layers;
   the second electrode has a property of transmitting light with a specific wavelength; and
   the reflective layer includes:
      a first insulative layer formed on the second electrode, the first insulative layer reflecting light with a specific wavelength; and
      a second layer formed on the first layer, the second layer reflecting the light with the specific wavelength at a high reflectivity.

8. A method for mounting a light emitting device, the method comprising:
   forming a semiconductor layer on a light transmissive substrate, the semiconductor layer including a light emitting layer;
   forming a first electrode lower than a plane running parallel through the light emitting layer with respect to the substrate and a second electrode higher than the plane running parallel through the light emitting layer with respect to the substrate;
   placing first and second lead frames in predetermined positions with respect to a light emitting device, the first lead frame including a first lead pad section to which the first electrode is connected, the second lead frame including a second lead pad section to which the second electrode is connected, and at least one of the first and second lead frames including a die pad section which is in contact with a back-side plane of the light transmissive substrate of the light emitting device, and wherein the die pad section is provided with a light transmission section.

9. A light emitting apparatus, comprising:
   a light emitting device for emitting light; and
   a first lead frame and a second lead frame on which the light emitting device is mounted, wherein:
   the light emitting device includes:
      a substrate which is light transmissive, the substrate defining a light output surface so that the light emitting device outputs light through the light output surface of the substrate;
      a semiconductor layer formed on the substrate, the semiconductor layer including a light emitting layer comprising a nitride semiconductor;

a first electrode provided lower than a plane running parallel through the light emitting layer with respect to the substrate; and a second electrode provided higher than the plane running parallel through the light emitting layer with respect to the substrate;

wherein the first lead frame includes a first lead pad section to which the first electrode is connected;

wherein the second lead frame includes a second lead pad section to which the second electrode is connected;

wherein at least one of the first and second lead frames includes a die pad section on which the light output surface of the substrate is mounted; and wherein the die pad section does not substantially cover the light output surface of the substrate so that the light emitting device emits light through said light output surface of said substrate.

10. The light emitting apparatus of claim 1, wherein the transmissive substrate defines a light emitting plane at said light output surface that is in contact with the light transmission section of the die pad section, and is between the light transmission section and the light emitting layer.

11. The light emitting apparatus of claim 1, wherein the light transmission section of the die pad section comprises an aperture defined in the die pad section.

* * * * *